(12) United States Patent
Soer et al.

(10) Patent No.: US 8,345,223 B2
(45) Date of Patent: Jan. 1, 2013

(54) OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

(75) Inventors: Wouter Anthon Soer, Nijmegen (NL); Vadim Yevgenyevich Banine, Deurne (NL); Johannes Hubertus Josephina Moors, Helmond (NL); Maarten Marinus Johannes Wilhelmus Van Herpen, Heesch (NL); Andrei Mikhailovich Yakunin, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 227 days.

(21) Appl. No.: 12/919,741

(22) PCT Filed: Feb. 24, 2009

(86) PCT No.: PCT/EP2009/001299
§ 371 (c)(1),
(2), (4) Date: Aug. 26, 2010

(87) PCT Pub. No.: WO2009/106291
PCT Pub. Date: Sep. 3, 2009

(65) Prior Publication Data
US 2011/0019174 A1    Jan. 27, 2011

Related U.S. Application Data

(60) Provisional application No. 61/064,313, filed on Feb. 27, 2008, provisional application No. 61/129,689, filed on Jul. 11, 2008.

(51) Int. Cl.
*G03B 27/54* (2006.01)
*G03B 27/42* (2006.01)
*G02B 27/14* (2006.01)

(52) U.S. Cl. .............................. 355/67; 355/53; 359/634
(58) Field of Classification Search ................... 355/53, 355/67–71; 359/359, 589, 634
See application file for complete search history.

(56) References Cited

U.S. PATENT DOCUMENTS 5,963,365 A    10/1999    Shirai .......................... 359/359
(Continued)

FOREIGN PATENT DOCUMENTS
EP    1 065 568    1/2001

OTHER PUBLICATIONS

Notification Concerning Transmittal of International Preliminary Report on Patentability from related International Application No. PCT/EP2009/001299, mailed Sep. 10, 2010.

(Continued)

*Primary Examiner* — Hung Henry Nguyen
(74) *Attorney, Agent, or Firm* — Pillsbury Winthrop Shaw Pittman LLP

(57) ABSTRACT

An optical element includes a first layer that includes a first material, and is configured to be substantially reflective for radiation of a first wavelength and substantially transparent for radiation of a second wavelength. The optical element includes a second layer that includes a second material, and is configured to be substantially absorptive or transparent for the radiation of the second wavelength. The optical element includes a third layer that includes a third material between the first layer and the second layer, and is substantially transparent for the radiation of the second wavelength and configured to reduce reflection of the radiation of the second wavelength from a top surface of the second layer facing the first layer. The first layer is located upstream in the optical path of incoming radiation with respect to the second layer in order to improve spectral purity of the radiation of the first wavelength.

34 Claims, 13 Drawing Sheets

U.S. PATENT DOCUMENTS

| | | | |
|---|---|---|---|
| 6,281,964 B1 | 8/2001 | Sato | 355/53 |
| 7,196,343 B2 | 3/2007 | Van Herpen et al. | 250/505.1 |
| 7,973,998 B2* | 7/2011 | Xue | 359/288 |
| 2003/0021997 A1 | 1/2003 | Veerasamy et al. | 428/411.1 |
| 2006/0002748 A1* | 1/2006 | Kudo et al. | 399/302 |
| 2006/0141367 A1 | 6/2006 | Bakker | 430/5 |
| 2007/0080307 A1 | 4/2007 | Bruijn et al. | 250/504 R |

OTHER PUBLICATIONS

International Search Report as issued for PCT/EP2009/001299, dated Jun. 4, 2009.

European Search Report dated Sep. 24, 2012 in corresponding European Patent Application No. 12 15 5788.

* cited by examiner

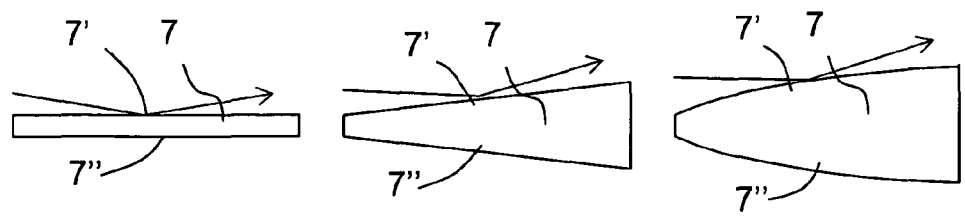
FIG. 10(a)  FIG. 10(b)  FIG. 10(C)
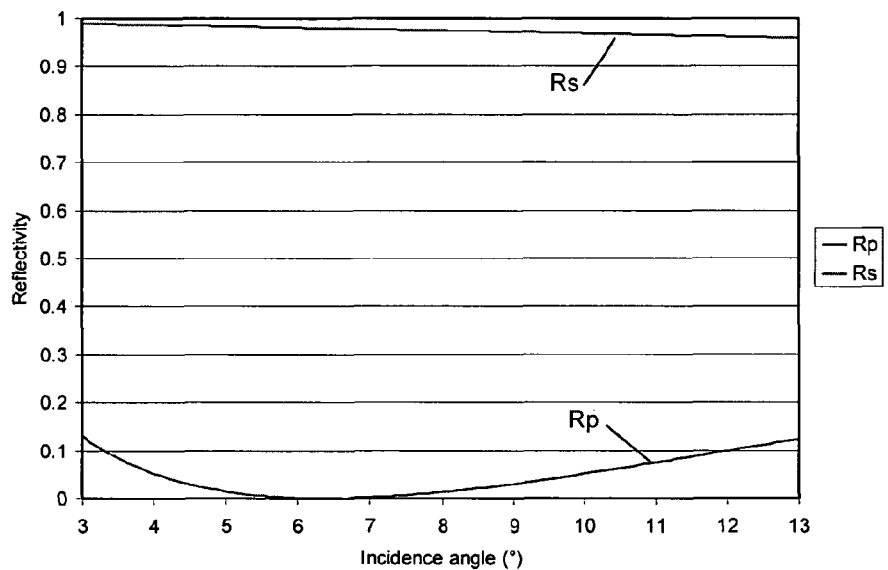
FIG. 11

OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

FIELD

The present invention relates to an optical element and lithographic apparatus including such an optical element, a method for manufacturing a device, and device manufactured thereby. More specifically, the optical element may be used as a reflective grazing-incidence spectral purity filter for Laser Produced Plasma (LPP) Extreme Ultraviolet (EUV) sources.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When using an LPP source, the laser radiation itself represents a significant amount of unwanted radiation that is emitted into the EUV lithography tool by scattering and reflection at the plasma. Typically, a $CO_2$ laser having a wavelength of around 10.6 μm is used. Since the optics of the EUV lithographic system have a high reflectivity at 10.6 μm, the laser radiation propagates into the lithography tool with significant power. Part of this power is eventually absorbed by the wafer causing unwanted heating of the wafer.

U.S. Pat. No. 7,196,343 B2 discloses a reflective grazing-incidence spectral purity filter (SPF) for filtering deep ultraviolet (DUV) radiation. This SPF comprises two perpendicular mirrors with an antireflection (AR) coating for DUV radiation of one polarization. By using two perpendicular reflections as shown in FIG. 5, the (mostly unpolarized) DUV radiation is effectively suppressed by absorption in the substrate. Furthermore, the AR coating is characterized in that it has a high reflectivity for EUV, so that EUV radiation is mostly reflected.

This spectral purity filter is not suited for suppressing 10.6 μm radiation in an LPP source for mainly two reasons: AR coatings for 10.6 μm generally have a very low reflectivity for EUV; and conventional mirror substrates reflect rather than absorb 10.6 μm radiation.

SUMMARY

Embodiments of the invention may improve the spectral purity by providing an optical element that includes a first layer comprising a first material, the first layer being reflective for radiation of a first wavelength, wherein the first layer is configured to be substantially transparent or absorptive for radiation of a second wavelength, a second layer comprising a second material, the second layer being configured to be substantially absorptive for the radiation of the second wavelength, the third layer comprising a third material in between the first layer and the second layer, and a third layer being at least partially transparent for the radiation of the second wavelength, wherein the first layer is located upstream in the optical path of incoming radiation with respect to the second layer in order to improve spectral purity of the EUV radiation.

According to an aspect of the invention, there is provided an optical element comprising: a first layer comprising a first material, the first layer being configured to be reflective for radiation of a first wavelength and at least partially transparent for radiation of a second wavelength; a second layer comprising a second material, the second layer being configured to be substantially absorptive for the radiation of the second wavelength, the third layer comprising a third material in between the first layer and the second layer, and a third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided an optical element comprising: a first layer comprising a first material, the first layer being configured to be reflective for radiation of a first wavelength in a first direction and at least partially transparent for radiation of a second wavelength; a second layer comprising a second material, the second layer being configured to be substantially reflective for radiation of the second wavelength in a second direction, the first direction and the second direction being substantially different from each other, and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided an optical element comprising: a first layer comprising a first material, the first layer being configured to be reflective for radiation of a first wavelength in a first direction and at least partially transparent for radiation of a second wavelength; a second layer comprising a second material, the second layer being configured to be substantially scattering for radiation of the second wavelength; and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a lithographic apparatus comprising: an illumination system configured to condition a radiation beam; a patterning device configured to pattern the radiation beam; a support configured to hold a substrate; and a projection system configured to project the patterned radiation beam onto a target portion of the substrate, wherein the illumination system and/or the projection system comprises an optical element comprising a first layer comprising a first material, the first layer being configured to be reflective for radiation of a first wavelength and at least partially transparent for radiation of a second wavelength; a second layer comprising a second material, the second layer being configured to be substantially absorptive for the radiation of the second wavelength, the third layer comprising a third material in between the first layer and the second layer, and a third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a lithographic apparatus comprising: an illumination system configured to condition a radiation beam; a patterning device configured to pattern the radiation beam; a support configured to hold a substrate; and a projection system configured to project the patterned radiation beam onto a target portion of the substrate, wherein the illumination system and/or the projection system comprises an optical element comprising a first layer comprising a first material, the first layer being configured to be reflective for radiation of a first wavelength in a first direction and at least partially transparent for radiation of a second wavelength; a second layer comprising a second material, the second layer being configured to be substantially reflective for radiation of the second wavelength in a second direction, the first direction and the second direction being substantially different from each other; and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a lithographic apparatus comprising: an illumination system configured to condition a radiation beam; a patterning device configured to pattern the radiation beam; a support configured to hold a substrate; and a projection system configured to project the patterned radiation beam onto a target portion of the substrate, wherein the illumination system and/or the projection system comprises an optical element comprising a first layer comprising a first material, the first layer being configured to be reflective for radiation of a first wavelength in a first direction and at least partially transparent for radiation of a second wavelength; a second layer comprising a second material, the second layer being configured to be substantially scattering for radiation of the second wavelength, the third layer comprising a third material in between the first layer and the second layer; and a third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a device manufacturing method comprising: patterning a radiation beam to form a patterned radiation beam; projecting the patterned radiation beam onto a substrate; and reflecting the radiation beam with at least one optical element comprising a first layer comprising a first material, the first layer being configured to be reflective for radiation of a first wavelength and at least partially transparent for radiation of a second wavelength; a second layer comprising a second material, the second layer being configured to be substantially absorptive for the radiation of the second wavelength; and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a device manufactured according to the method of: patterning a radiation beam to form a patterned radiation beam; projecting the patterned radiation beam onto a substrate; and reflecting the radiation beam with at least one optical element comprising a first layer comprising a first material, the first layer being configured to be reflective for radiation of a first wavelength and at least partially transparent for radiation of a second wavelength; a second layer comprising a second material, the second layer being configured to be substantially absorptive for the radiation of the second wavelength; and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a device manufacturing method comprising: patterning a radiation beam to form a patterned radiation beam; projecting the patterned radiation beam onto a substrate; and reflecting the radiation beam with at least one optical element comprising a first layer comprising a first material, the first layer being configured to be reflective for radiation of a first wavelength in a first direction and at least partially transparent for radiation of a second wavelength; a second layer comprising a second material, the second layer being configured to be substantially reflective for radiation of the second wavelength in a second direction, the first direction and the second direction being substantially different from each other; and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

According to an aspect of the invention, there is provided a device manufacturing method comprising: patterning a radiation beam to form a patterned radiation beam; projecting the patterned radiation beam onto a substrate; and reflecting the radiation beam with at least one optical element comprising a first layer comprising a first material, the first layer being configured to be reflective for radiation of a first wavelength in a first direction and at least partially transparent for radiation of a second wavelength; a second layer comprising a second material, the second layer being configured to be substantially scattering for radiation of the second wavelength, and a third layer comprising a third material in between the first layer and the second layer, the third layer being at least partially transparent for the radiation of the second wavelength, the first layer being located upstream in the optical path of incoming radiation with respect to the second layer in order to improve spectral purity of the radiation of the first wavelength.

For instance, in embodiments of the invention, the radiation of the first wavelength can be EUV radiation, the radiation of the second wavelength can be $CO_2$ or yttrium aluminum garnet (YAG) laser radiation.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 10*a-c* depict schematic cross sectional views of embodiments of the optical element;

FIG. 11 depicts reflectivity of 3° tapered optical element at 10.6 μm for p-polarization ($R_p$) and s-polarization ($R_s$);

DETAILED DESCRIPTION

Figure 1:
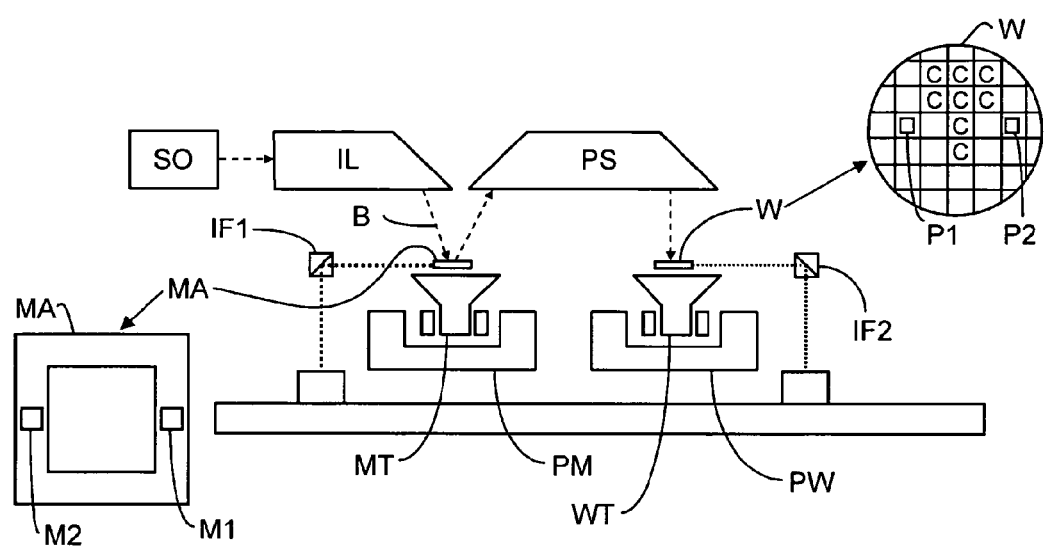
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation, DUV radiation, EUV radiation or radiation with even smaller wavelength than EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if desired, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
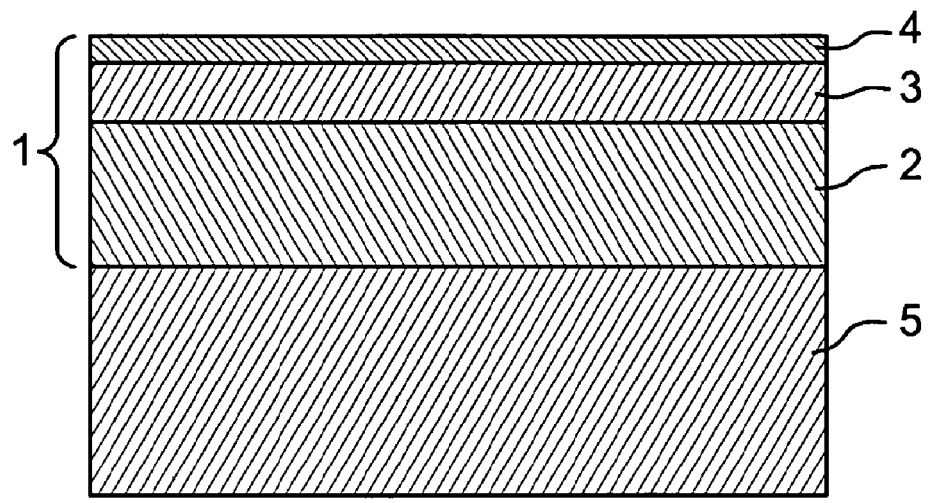
FIG. 2 depicts an embodiment of an optical element of the lithographic apparatus of FIG. 1.

In FIG. 2, an embodiment of an optical element 1 is depicted. In the illustrated embodiment, the optical element 1 comprises a first layer 4, a second layer 2, and a third layer 3. In the embodiment of FIG. 2, the first layer 4 is arranged upstream in the optical path of incoming radiation with respect to the second layer 2 and the third layer 3, and the third layer 3 is arranged upstream in the optical path of incoming radiation with respect to the second layer 2. In an embodiment, the first layer 4 is arranged on top (e.g., on a top surface) of the third layer 3, and the third layer 3 is arranged on top (e.g., on a top surface) of the second layer 2.

The first layer 4 may comprise suitable non-metals, such as a diamond-like carbon, or $TiO_2$, or a mixture thereof, in part because metals will generally reflect 10.6 μm radiation even when applied as a very thin layer. The first layer 4 is, in this embodiment, an EUV reflective capping layer. Additionally, the first layer 4 may be at least partially transparent to radiation of a wavelength of about 100 nm to about 300 nm which is a wavelength range often referred to as deep ultraviolet (DUV) radiation, thereby acting as a so-called antireflective (AR) coating for DUV radiation. In an embodiment, the first layer 4 is substantially transparent to DUV radiation. The first layer 4 has a suitable reflectivity for EUV. The first layer may have a thickness in the range of about 1 nm to about 50 nm, or about 1 nm to about 20 nm, or about 20 nm, or about 10 nm.

The third layer 3 may be a so-called antireflection coating and may be tuned to be transparent to radiation of a wavelength of 10.6 μm. A purpose of the third layer 3 is to further reduce the reflection of 10.6 μm radiation from the second layer 2. The optimal parameters depend on the material of the second layer 2 and the range of grazing angles for which the reflectivity should be reduced. The third layer 3 may comprise one or more materials such as ZnSe, ZnS, GaAs and Ge, and/or low refractive index halides, such as $ThF_4$ and $YF_3$.

The second layer 2 is a layer of a material with a high absorption coefficient for radiation having a 10.6 μm wavelength. The second layer 2 may comprise materials such as ceramics, for instance $Al_2O_3$ or $TiO_2$, or some glasses, such as fused silica or $SiO_2$. The material may have a low intrinsic grazing-incidence reflectivity for radiation having a 10.6 µm wavelength. $TiO_2$, for instance, has a much lower reflectivity than $Al_2O_3$. The thickness of the second layer 2 is chosen such that essentially all radiation having a 10.6 µm wavelength is absorbed in the layer, so that reflection at the bottom side of the layer is reduced or eliminated. The thickness of the second layer 2 may be between about 0.01 mm and about 1 mm, for example about 0.05 mm.

The third layer 3 may be configured to be transparent to radiation of a wavelength of 10.6 µm, and the first layer 4 (EUV reflective capping layer) may have a thickness which is an antireflection coating for DUV radiation. Thus, the optical element may combine suppression of two kinds of radiation, namely radiation with a wavelength of 10.6 µm and DUV radiation: radiation with a wavelength of 10.6 µm incident on the optical element may propagate through the first layer 4 and the third layer 3, and be absorbed by the second layer 2; and DUV radiation may be suppressed by the first layer 4, which acts as an antireflection coating for the DUV radiation.

In the embodiment of FIG. 2, typical values for the total reflectivity are 85.1% for EUV radiation, 10-40% for DUV radiation, and 10.7% for radiation having a 10.6 µm wavelength.

The optical element 1 may be provided on a substrate 5. Such is the case in the embodiment of FIG. 5. The second layer 2 may absorb a substantial amount of heat (typically of the order of 100 W/cm$^2$). Therefore, the optical element 1 may be deposited on a substrate 5 with a high thermal conductivity, for example Cu, from which the heat can efficiently be transported away. Further cooling means (e.g. water cooling) may be applied to purpose enhance cooling even further.

Figure 3:
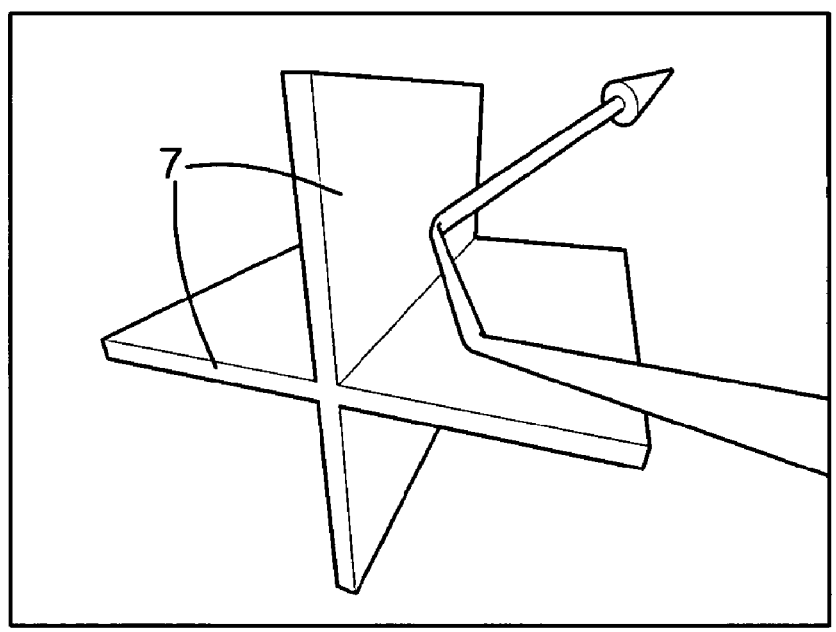
FIG. 3 depicts an embodiment of an optical device according to the invention.

In FIG. 3, an embodiment is depicted, in which two mirrors 7 are arranged in a direction transverse with respect to each other. Both of these mirrors 7 are double-sided such that both sides comprise an optical element as disclosed by FIG. 2. The embodiment of FIG. 3 may suitably be placed at a so-called intermediate focus which is a focal point in which radiation emitted by the source SO is focused by a collector. A potential advantage of placing the optical device shown in FIG. 3 at the intermediate focus is that, at least for sufficiently thin mirrors 7, the influence this embodiment has on imaging of the source is very much limited. Also, incidence angles are small, resulting in high EUV reflectivity.

Typical incidence angles of incidence at the intermediate focus may range from about 2° to about 9° with respect to the optical axis. This is relevant for the design of the AR coatings, which are optimized within a certain angular range. Although the minimum incidence angle from the optical axis may be about 2°, the minimum incidence angle on the mirrors can be about 0°. Therefore, the mirrors may be optimized for the range from about 0° to about 9°.

An embodiment of the optical element 1 for this angular range may be configured as follows: a first layer 4 formed by a diamond-like carbon having a thickness of 20 nm; an intermediate layer formed by Ge having a thickness of 420 nm; a third layer 3 formed by $ThF_4$ having a thickness of 5100 nm; a further intermediate layer formed by Ge having a thickness of 500 nm; and a second layer 2 formed by a—$SiO_2$ having a thickness of 50 µm.

Diamond-like carbon layers adhere well to carbide-forming materials such as Ge and can be made to subnanometer roughness as desired for high EUV reflectivity as shown in L. Tao, S. Ramachandran, C. T. Nelson, T. H. Lee, L. J. Overzet, M. J. Goeckner, M. J. Kim, G. S. Lee and W. Hu, "Nanofabrication of Diamond-like Carbon Templates for Nanoimprint Lithography," Mater. Res. Soc. Symp. Proc., Diamond Electronics—Fundamentals to Applications (2007), 243.

Figure 4:
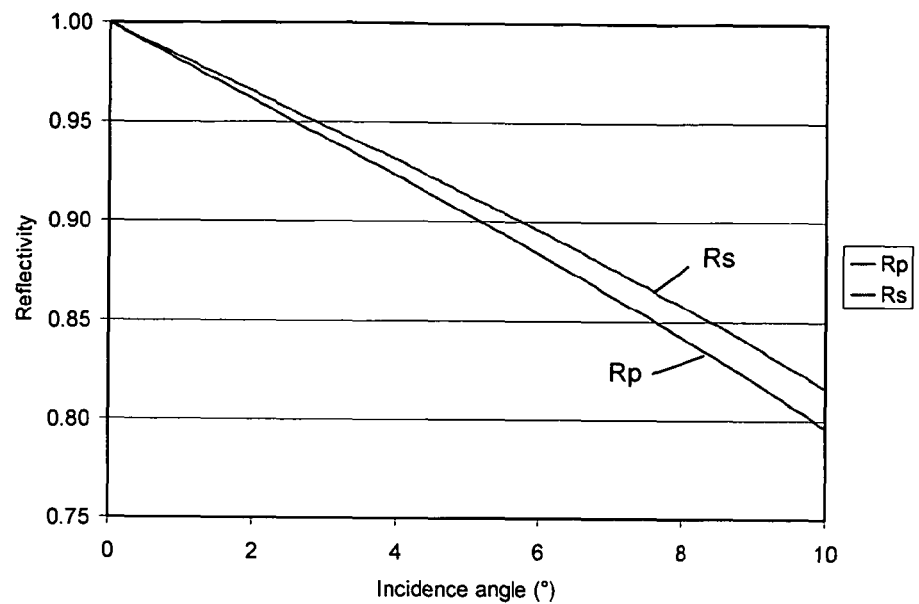
FIG. 4 depicts reflectivity of the optical element of FIG. 2 for radiation with a wavelength of 13.5 nm for p-polarization ($R_p$) and s-polarization ($R_s$)

FIG. 4 shows an example of the reflectivity of an embodiment of the optical element for p-polarization ($R_p$) and s-polarization ($R_s$) at 13.5 nm. At this wavelength, the reflectivity is solely determined by the diamond-like carbon as the first layer 4. The effect of the polarization is very small and the reflectivity is >80% over the entire angular range.

Figure 5:
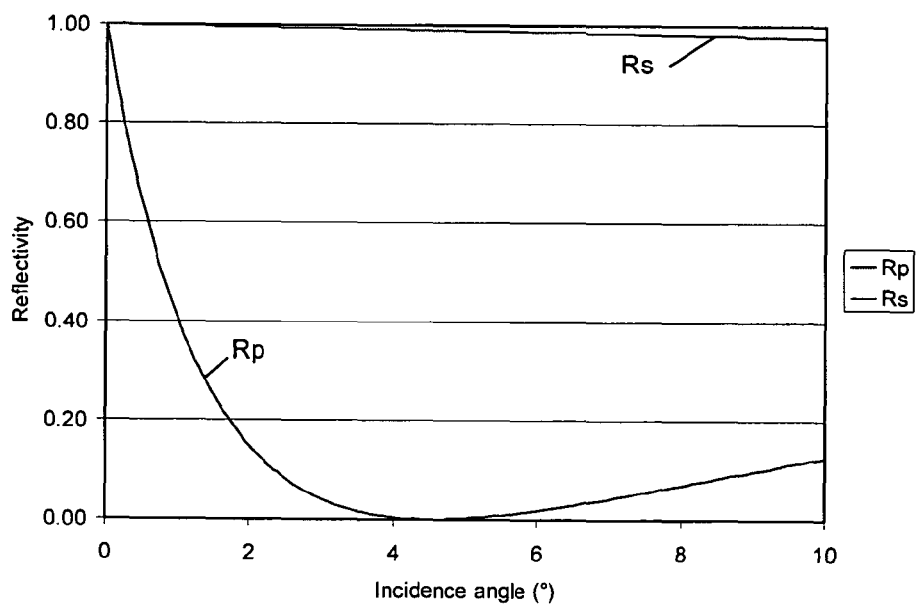
FIG. 5 depicts reflectivity of the optical element of FIG. 2 for radiation with a wavelength of 10.6 μm for p-polarization ($R_p$) and s-polarization ($R_s$)

However, at 10.6 µm, there is a large difference in reflectivity for p-polarization ($R_p$) and s-polarization ($R_s$) as shown in FIG. 5. The purpose of the AR coating is to suppress the p-polarized radiation. The s-polarized radiation is then suppressed by the other mirror, for which it is p-polarized again (see FIG. 3). For this example, the antireflective properties of the AR coating are optimal at an angle of 4.5° with a p-polarisation reflectivity of less than 0.5% (Rp<0.5%). Towards the high end of the angular range, the p-polarisation reflectivity may increase to about 10%; at zero incidence angle it approaches 100%.

The combined reflectivity of the two mirrors 7 of the optical device of FIG. 3 at any incidence angle is given by [Rp(θ)Rs(φ)+Rs(θ)Rp(φ)]/2, where θ is the incidence angle on the first mirror and φ the incidence angle on the second mirror.

To obtain the total reflectivity of the optical device, integration over the appropriate range of angles (θ, φ) is calculated by:

$$R = \frac{\int_{\theta_{min}}^{\theta_{max}} \left[ \int_{\varphi_{min}(\theta)}^{\varphi_{max}(\theta)} \frac{1}{2} \left( \begin{array}{c} R_p(\theta)R_s(\varphi) + \\ R_s(\theta)R_p(\varphi) \end{array} \right) \cos\varphi d\varphi \right] d\theta}{\int_{\theta_{min}}^{\theta_{max}} \left[ \int_{\varphi_{min}(\theta)}^{\varphi_{max}(\theta)} \cos\varphi d\varphi \right] d\theta} \quad (1)$$

In equation (1), it is assumed that the radiation intensity distribution is constant over the integration range. The intensity distribution generally depends on the collector geometry. For a typical ellipsoidal collector, the intensity increases slightly towards the optical axis, but calculations show that this has only a minor effect on the reflectivity. With these boundary conditions, typical values for the total reflectivity are 85.1% at 13.5 nm and 10.7% at 10.6 µm, i.e. the total spectral purity is increased by a factor of 8.

Figure 6:
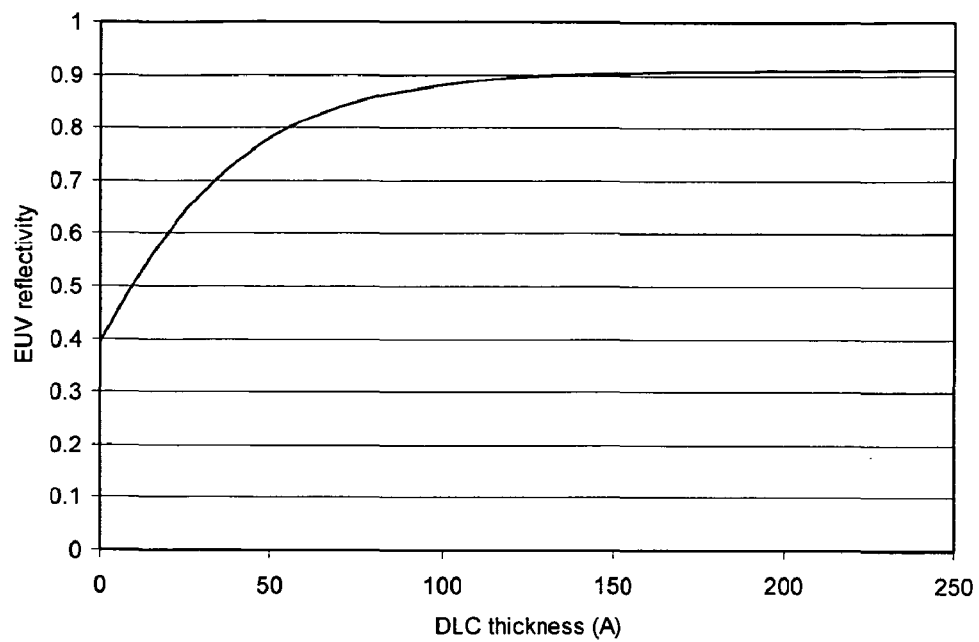
FIG. 6 depicts EUV reflectivity of the optical element of FIG. 2 at an angle of incidence of 5° as a function of layer thickness.
Figure 7:
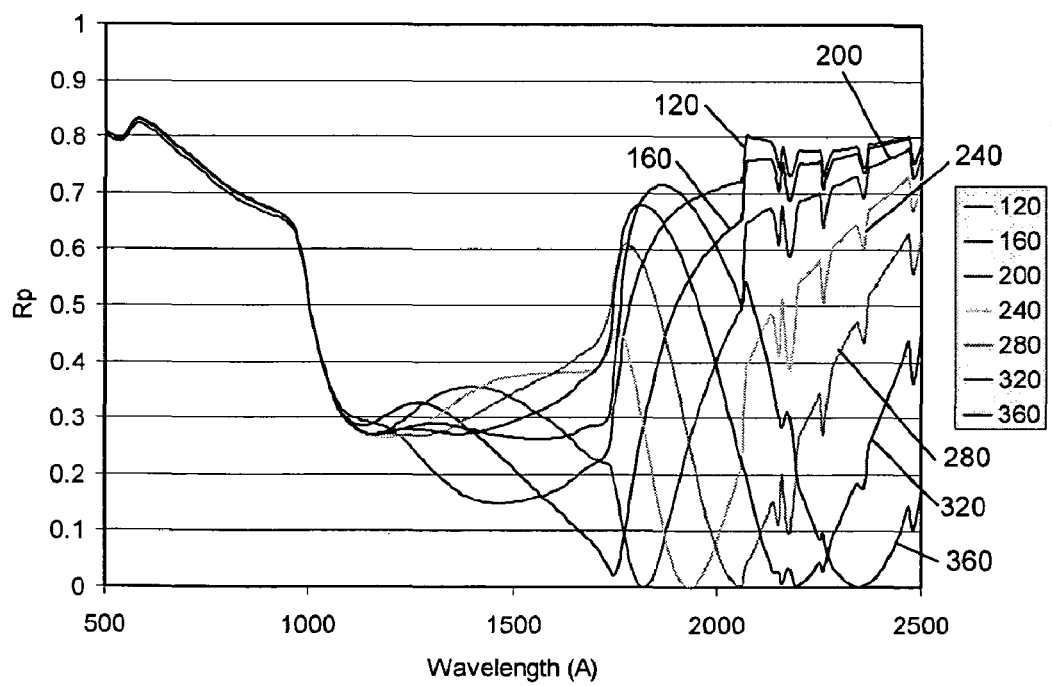
FIG. 7 depicts DUV reflectivity for p-polarization of the optical element of FIG. 2 at an incidence angle of 5°.
Figure 8:
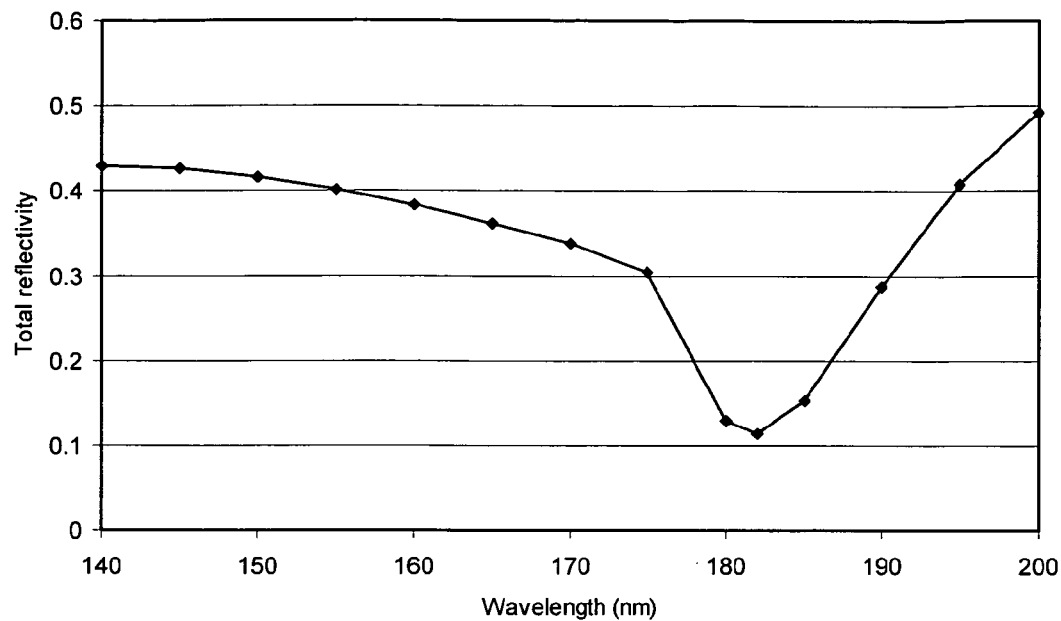
FIG. 8 depicts total reflectivity of the optical device of FIG. 3 in the DUV regime.

As mentioned above, the thickness of the EUV reflective capping layer (first layer) 4 is chosen such that reflection of DUV radiation is limited. As shown in FIG. 6, the thickness may be of the order of 10 nm or larger in order to maintain a high EUV reflectivity. FIG. 7 shows the reflectivity for p-polarization in the DUV regime, which depends on the thickness of the diamond-like carbon layer, typically 12-36 nm (120-360 Å). The legend values indicate the thickness of the diamond-like carbon layer in angstroms (Å). For the embodiment of FIG. 2 with a diamond-like carbon layer thickness of 20 nm, the total DUV reflectivity of the optical device, calculated according to equation (1), is between 10% and 40% as can be seen in FIG. 8. The layer for which FIG. 8 is plotted is a diamond-like carbon layer having a 20 nm thickness.

Figure 9:
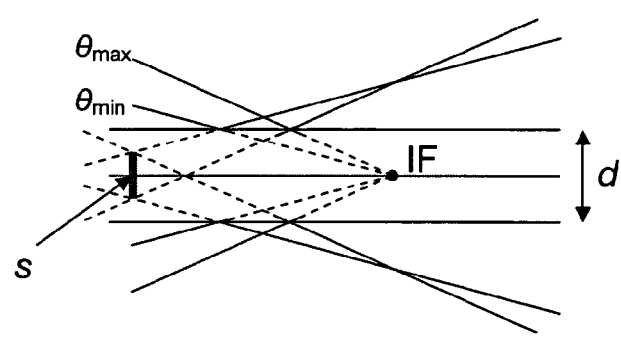
FIG. 9 illustrates etendue increase due to non-zero mirror thickness.

The total thickness of the optical element 1 should be as low as possible in order to minimize distortion of the source image. In FIG. 9 it is illustrated that a point source IF is stretched to a size s given by:

$$s = 2d \frac{\tan\theta_{max} - \tan\theta_{min}}{\tan\theta_{max} + \tan\theta_{min}} \quad (2)$$

For example, in a typical embodiment with total thickness d=200 µm (100 µm Cu cooling substrate+2×50 µm multilayer on both sides), the virtual source size s=173 μm. This is small compared to realistic EUV pinch sizes and therefore an embodiment of the optical element having a thickness d of 200 μm is not expected to result in a significant increase of the etendue.

In the embodiment of FIG. 2, some of the radiation is reflected at small angles, especially at the vertical mirror, where there is no lower bound to the incidence angle due to obscurations. At these low angles, the performance of the AR coating for 10.6 μm is relatively poor as shown in FIG. 5. This leads to a highly non-uniform IR far-field pattern and a sub-optimal performance in terms of total spectral purity.

In an embodiment, the minimum incidence angles for both mirrors are increased by blocking radiation that is incident at very small angles. For example, an optical device may be provided with, in use, minimum incidence angles of $\theta_{min}=2°$ and $\phi_{min}=2°$ for the first and the second mirror, respectively. For these parameters, the total reflectivity of 10.6 μm wavelength radiation is reduced from 10.7% to 3.52%, while the total reflectivity at 13.5 nm is barely affected (from 85.1% to 83.2%). Therefore, the spectral purity is increased by a factor of 24, compared to a factor of 8 in the embodiment of FIG. 2. However, due to the additional obscuration, the throughput is reduced to 72% of the basic embodiment, because part of the EUV radiation is now blocked.

For some applications, obscurations in a specific direction are not allowed. For example, in a scanner tool, obscurations are not allowed in a certain direction, i.e. parallel to a scan line. Therefore, in a further embodiment, the mirrors are rotated such that they are still substantially perpendicular to one another but neither of them is parallel to the scan line, e.g. both mirrors may be tilted 45° from the scan line.

Figure 12:
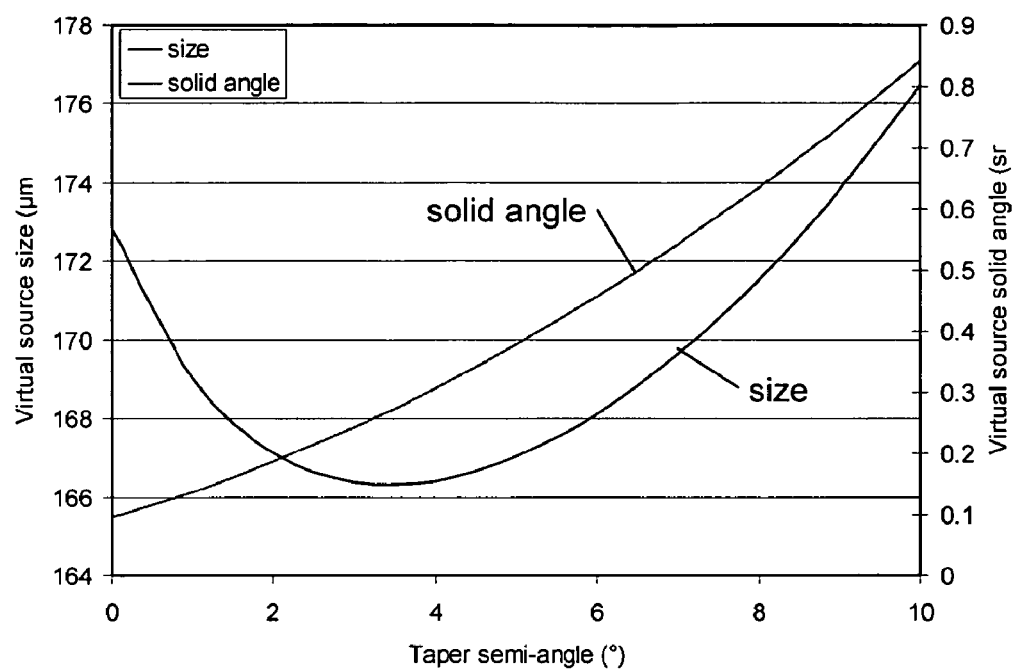
FIG. 12 depicts a virtual source size and a virtual solid angle for a point source as a function of a semi-angle of a tapered embodiment of the optical element with incidence of 10°.
Figure 13:
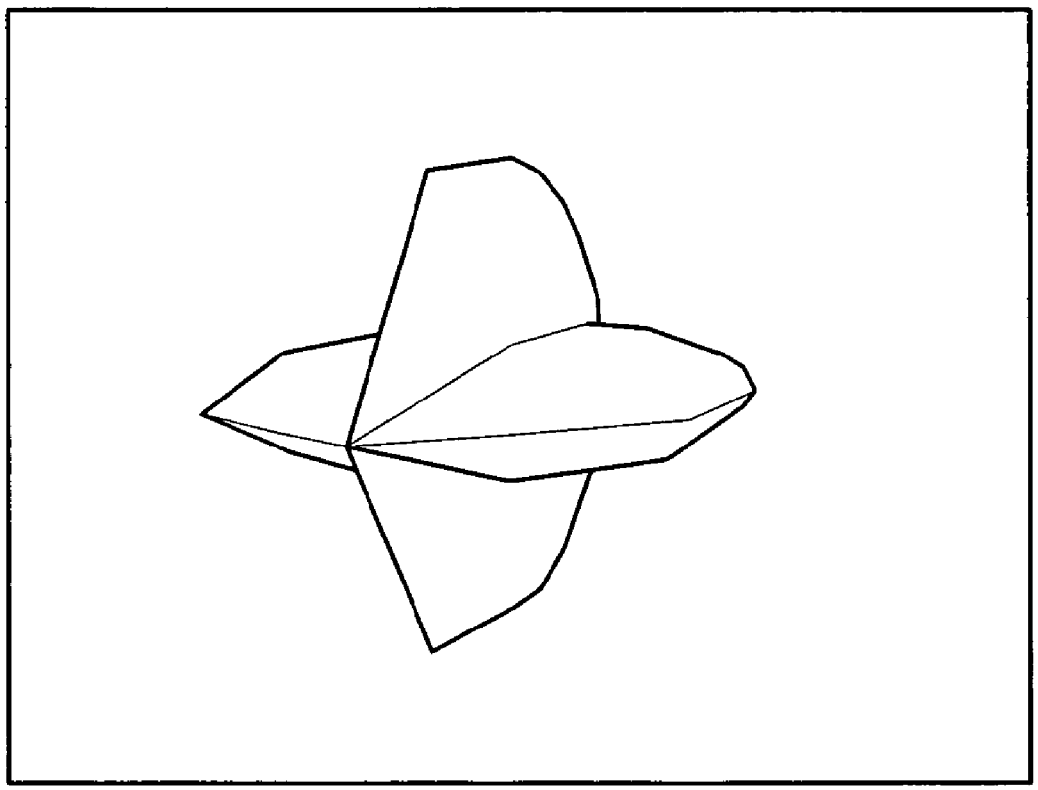
FIG. 13 depicts a three-dimensional impression of an embodiment with curved mirrors.

In an embodiment, reflective surfaces 7' and 7" of one or both mirrors 7 are not parallel, as in FIG. 10a, but tapered towards the source, as in FIG. 10b, or curved towards the source, as in FIG. 10c. A potential advantage of a tapered or wedged mirror is that the incidence angle range may be shifted to higher values, at which the 10.6 μm radiation can be better suppressed. For example, if the taper semi-angle is 3°, the range of incidence angles is shifted from 0-10° to 3-13°. FIG. 12 depicts a virtual source size and a virtual solid angle for a point source as a function of a semi-angle of a tapered embodiment of the optical element with incidence of 10°.

The parameters of the AR coating can be re-optimized to the range of incidence angles for the optical element of FIG. 10b. For example, the total multilayer may be as follows:

An embodiment of the optical element 1 for this angular range may be configured as follows: a first layer 4 formed by a diamond-like carbon having a thickness of 20 nm; an intermediate layer formed by Ge having a thickness of 715 nm; a third layer 3 formed by ThF$_4$ having a thickness of 1400 nm; and a second layer 2 formed by a—SiO$_2$ having a thickness of 50 μm.

FIG. 11 shows the reflectivity of this mirror at 10.6 μm. The reflectivity for p-polarized radiation is much lower than in the basic embodiment, with R$_p$<13% for all incidence angles. For some embodiments of the optical element according to the invention, the device consisting of two tapered mirrors, the total reflectivity may become 5.66% for 10.6 μm and 74.6% for 13.5 nm. Hence, the spectral purity may be increased by a factor of 13, compared to a factor of 8 in the embodiment of FIG. 2. Here, the fact that for two tapered mirrors, the two reflections are no longer exactly perpendicular was neglected. For instance, for a wedge semi-angle of 3°, the angle between the two surfaces is 89.84° instead of 90°, so this effect is indeed likely to be very small.

The embodiment with wedged mirrors changes the source image in a way different from the embodiment of FIG. 2 with flat mirrors. For a wedge semi-angle α and thickness d, a point source is stretched to a virtual source size given by:

$$s = 2d\left(\frac{\sin(\theta_{min}+\alpha)\cos\alpha}{\sin\theta_{min}}\right)\left(\frac{\tan(\theta_{max}+2\alpha)-\tan(\theta_{min}+2\alpha)}{\tan(\theta_{max}+2\alpha)+\tan(\theta_{min}+2\alpha)}\right) \quad (3)$$

which reduces to equation (2) for α=0°. The tapering also affects the solid angle in which the radiation is emitted downstream in the optical path with respect to the intermediate focus. The solid angle Ω increases from $2\pi(1-\cos\theta_{max})$ to $2\pi[1-\cos(\theta_{max}+2\alpha)]$. FIG. 11 shows both effects as a function of α. For a typical embodiment with α=3°, the etendue (~Ωs$^2$) increases by an estimated factor of 2.4, which may be acceptable depending on the etendue requirements and the original etendue of the source.

In an embodiment, the optical elements, e.g. mirrors, are curved as shown in FIG. 10c. The curvature of at least part of the mirror surface may be such that, for radiation emitted by the source SO and focused onto the intermediate focal point by the collector CO, the intermediate focal point is positioned at a predetermined location with respect to the optical element, the incidence angle is the same at regardless of the location where the radiation is incident, and the etendue is least affected. This is possible because the angle of the radiation from the optical axis varies with the position on the mirror due to its finite thickness. For example, the mirror can be made such that all radiation is reflected at 4.5° grazing incidence. In this case, the reflected radiation is emitted within 5° from the optical axis, i.e. the solid angle is reduced. The virtual source size will also change depending on the exact shape of the mirror. This will determine the eventual increase of the etendue.

At a reflection angle of 4.5°, the AR coating of the embodiment of FIG. 2 has its maximum suppression of 10.6 μm radiation (see FIG. 5). Therefore, the total reflectivity is as low as 0.05% at 10.6 μm and as high as 84.3% at 13.5 nm. By decreasing the angle at which the radiation is reflected, the total EUV reflectivity can be increased even further (up to 92.8% for 2°). It should be noted that this example is given for the ideal case of a point source. With a finite source size, there is typically a non-zero range of incidence angles at each point of the mirror surface. Consequently, the AR coating may not be optimized for a single angle but for a range of angles and hence the total reflectivity for 10.6 μm radiation may in practice be higher.

In an embodiment, the parameters of the coating are varied as a function of the lateral position on the mirror. The coating at each position may have such parameters that the reflectivity of p-polarized 10.6 μm radiation is minimal for the incidence angle corresponding to that position. This is generally possible because at any given position on the mirrors, radiation comes in at only one incidence angle. R$_p$ values below 0.05% can be achieved for all angles down to approximately 2°. For example, R$_p$=0.04% at a 10° angle of incidence may be achieved for an optical element having the following configuration: a first layer 4 formed by a diamond-like carbon having a thickness of 20 nm; an intermediate layer formed by Ge having a thickness of 730 nm; a third layer 3 formed by ThF$_4$ having a thickness of 980 nm; a further intermediate layer formed by Ge having a thickness of 1500 nm; and a second layer 2 formed by a—SiO$_2$ having a thickness of 50 μm.

R$_p$=0.04% at a 2° angle of incidence may be achieved for the following configuration: a first layer 4 formed by a diamond-like carbon having a thickness of 20 nm; an intermediate layer formed by Ge having a thickness of 710 run; a second layer 3 formed by $ThF_4$ having a thickness of 2500 nm; a further intermediate layer formed by Ge having a thickness of 700 nm; and a second layer 2 formed by a—$SiO_2$ having a thickness of 50 μm.

Figure 14:
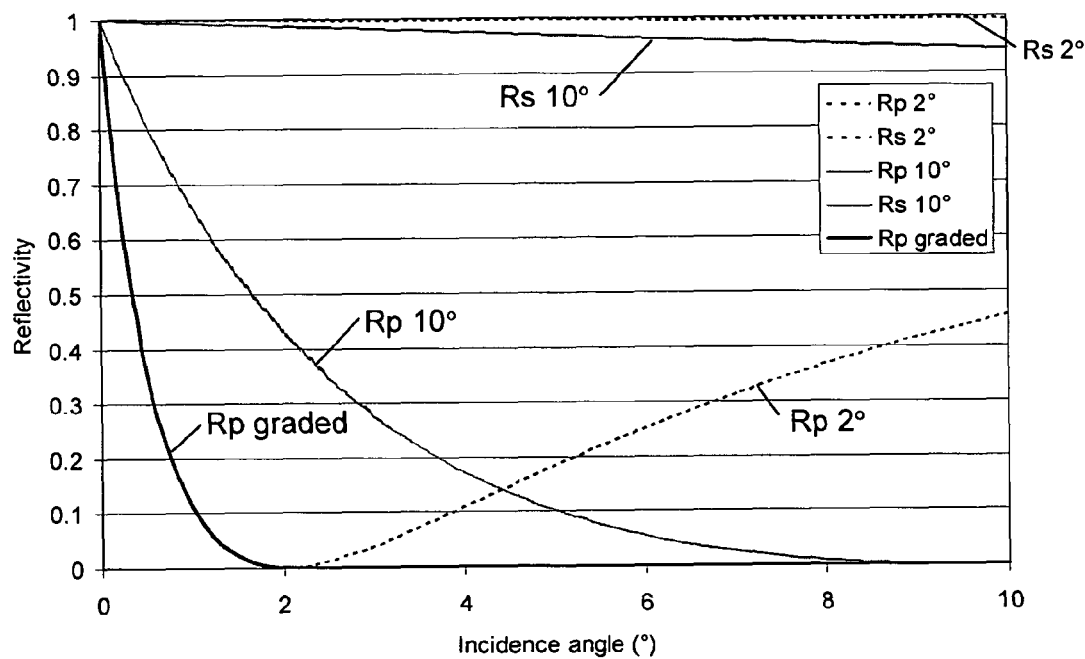
FIG. 14 depicts reflectivity curves for multilayer optical elements optimized for 2° incidence angle, for 10° incidence angle, and for a graded multilayer optical element optimized to the local incidence angle.
Figure 15:
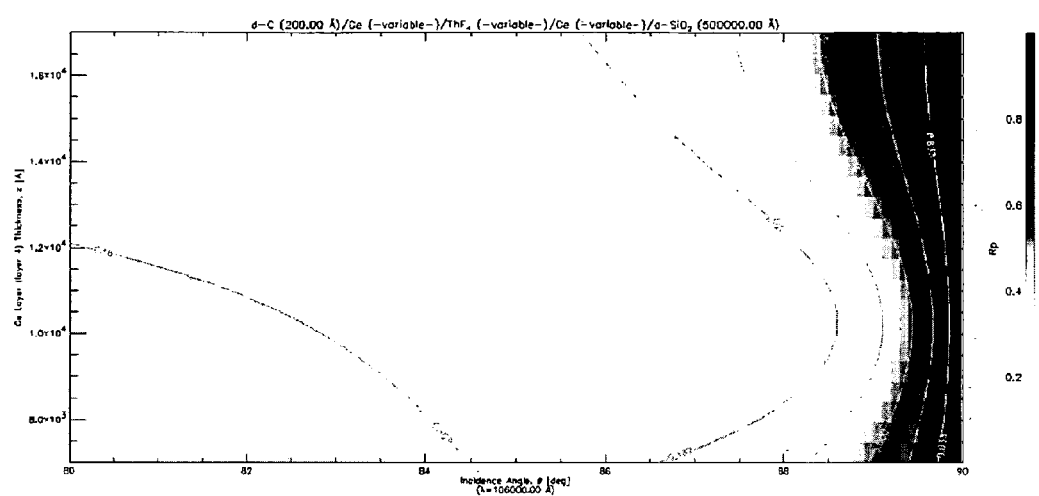
FIG. 15 depicts reflectivity $R_p$ at 10.6 μm of a diamond-like carbon/Ge/ThF$_4$/Ge/a—SiO$_2$ multilayer optical element as a function of incidence angle and thickness of the second Ge layer.

Reflectivity as a function of angle of incidence for these two multilayers are shown in FIG. 14. FIG. 15 shows that even by merely changing one parameter, i.e. the thickness of one of the Ge layers, optimization of the coating over a large range of angles can be achieved.

For the calculation of the total reflectivity at 10.6 μm, we take an optical element with flat mirrors similar to the configuration of the first embodiment, and use a coating with $R_p$ values equal to 0.04% for angles smaller than or equal to 2°, and $R_p$=0.05% for angles>2°.

The reflectivity for s-polarization $R_s$ is assumed to be 1 for all angles. This leads to a total reflectivity of 3.29% at 10.6 μm, and 85.1% at 13.5 nm. Hence, the spectral purity is increased by a factor of 26. Again, this may only hold in the ideal case of a point source. With a finite source size, there is typically a non-zero range of incidence angles at each point of the mirror surface. Consequently, the AR coating may not be optimized for a single angle but for a range of angles and hence the total reflectivity for 10.6 μm radiation may in practice be higher.

Likewise, the thickness of the first layer 4 (EUV reflective capping layer) may also be varied as a function of lateral position in order to optimize DUV suppression at each incidence angle. In an embodiment, the range for the thickness of the first layer 4 is about 10 nm to about 50 nm. At lower thickness, the EUV reflectivity may drop significantly (see FIG. 6), whereas at higher thickness, the IR reflectivity may start to increase.

Atomic hydrogen may be present at the intermediate focus, particularly in an LPP source. This hydrogen may be used to further cool the optical element. In an embodiment, a protective capping layer may be deposited on top on the first layer 4 to protect the optical element from hydrogen-induced damage. For example, a $Si_3N_4$ layer of a few nanometers thickness may be used without an appreciable effect on the reflectivity. When a diamond-like carbon layer is used as the first layer 4 (as in the embodiments described above), a protective layer may not be needed since diamond-like carbon is not much affected by atomic hydrogen.

In an embodiment, the optical element does not need to be arranged in a cross shape and/or at intermediate focus, but in another pair of two perpendicular mirrors. For example, the optical element may be implemented as two perpendicular grazing-incidence mirrors in the projection optics. Also, the third layer 3 disclosed here may be applied on other grazing-incidence mirrors (e.g. the g mirror) instead of or in addition to the ones at intermediate focus to enhance spectral purity.

Figure 16:
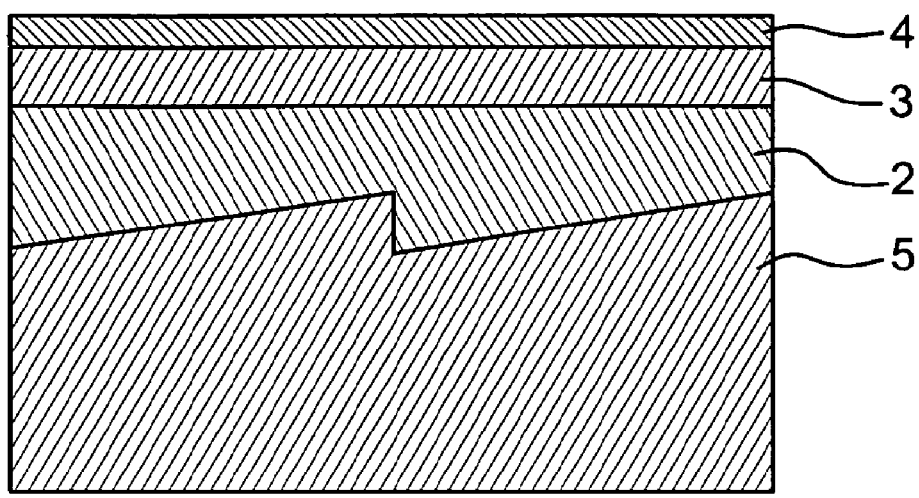
FIG. 16 depicts an embodiment of an optical element of the lithographic apparatus of FIG. 1.

Another embodiment of an optical element comprises the following components as shown in FIG. 16: a reflective layer 5 of a material with a high reflectivity at 10.6 μm, a second layer 2 of a material transparent at 10.6 μm, a third layer 3 tuned for 10.6 μm, and an EUV reflective first layer 4.

The material of the reflective layer 5 is chosen to have a high reflectivity at 10.6 μm. Most metals (e.g. Mo) fall in this category. The thickness of this layer is desirably only as large as minimally needed for mechanical robustness of the mirror, e.g. 0.2 mm. Alternatively, the layer can be thinner and mounted on a supporting substrate.

The purpose of the second layer 2 is to transmit the 10.6 μm radiation to the reflective layer 1 while providing a flat basis for the EUV reflective first layer 4. Therefore, the thickness of this layer may not be uniform. This second layer 2 is desirably made of $CO_2$ laser window materials such as ZnSe, ZnS, GaAs and Ge.

The third layer 3 may further reduce the reflectivity from the second layer 2. The optimal parameters of this coating depend on the range of grazing angles for which the reflectivity should be reduced. The third layer 3 may comprise for example $CO_2$ laser window materials such as ZnSe, ZnS, GaAs and Ge, and/or low refractive index halides such as $ThF_4$ and $YF_3$.

The first layer 4 has a high reflectivity for EUV, for which typically a thickness of the order of 10 nm is desired. Since metals will generally reflect 10.6 μm radiation even when applied as a very thin layer, the first layer 4 is desirably made of a non-metallic material, for example diamond-like carbon (DLC) or $TiO_2$.

Since the first layer 4 also acts as an anti-reflection (AR) coating for DUV, its thickness is tuned so as to give the desired suppression in the DUV range.

In this embodiment, two mirrors are arranged in a cross shape and placed at intermediate focus (see also FIG. 1). The structure shown in FIG. 16 is applied on both sides of each mirror.

It may be assumed that a typical incidence angles at intermediate focus ranges from 2° to 9° from the optical axis. This is relevant for the design of the AR coatings, which are optimized within a certain angular range. Also, it is relevant for choosing the angle between the IR reflective surface and the EUV reflective surface. Although the minimum incidence angle from the optical axis is 2°, the minimum incidence angle on the mirrors is (close to) 0°. Therefore, the mirrors should be optimized for the range from 0° to 9°.

A typical embodiment for this angular range can be as follows:

DLC [20 nm]/Ge [420 nm]/$ThF_4$ [5100 nm]/Ge [500 nm]/ZnSe [varying]/Mo.

Here, DLC is the EUV reflective cap layer, the Ge/$ThF_4$/Ge stack is the AR coating, ZnSe is the separation layer and Mo is the inclined infrared reflecting layer.

Considering the angular range from 0° to 9°, the surface of layer 1 desirably makes an angle of at least 5° with the surface of first layer 4, so that the infrared radiation is reflected at least 10° from the optical axis and thus is separated from the EUV radiation. Typically, the mirror length along the optical axis will be of the order of 1 cm. Therefore, if the surface of reflection layer 1 were continuous, the desired thickness of the stack shown in FIG. 16 would be of the order of 1 mm, and the total thickness of the double-sided mirror would be about 2 mm. In order to maintain an acceptable etendue, it is desirable to have a lower thickness. This may be achieved by using a sawtooth-shaped reflection layer 1 as shown in FIG. 16. For example, the sawtooth may have a period of 1 mm, so that the thickness of the stack is reduced to about 0.1 mm.

In another embodiment, the period of the reflection layer 1 becomes of the order of the infrared wavelength (10.6 μm), for example smaller than 0.1 mm. In this embodiment, the reflection layer 1 may act as a reflection grating, which may diffract $CO_2$ or YAG laser radiation (reflect $CO_2$ or YAG laser radiation into multiple diffraction orders). The surface profile may be optimized so as to direct most of the radiation in diffraction orders outside the EUV beam.

FIG. 4 shows the reflectivity of the embodiment of FIG. 16 for p-polarization and s-polarization at 13.5 nm. FIG. 5 shows the reflectivity at 10.6 μm. At wavelength of 13.5 nm, the reflectivity is solely determined by the DLC cap layer. The effect of the polarization is very small and the reflectivity is >80% over the entire angular range. At wavelength of 10.6

µm, there is a large difference in reflectivity for p-polarization and s-polarization. The purpose of the AR coating is to suppress the p-polarized radiation. The s-polarized radiation is then suppressed by the other mirror, for which it is p-polarized again. For this example, the antireflective properties of the AR coating are optimal at an angle of 4.5° with Rp<0.5%. Towards the high end of the angular range, the reflectivity increases to about 10%; towards zero incidence angle it (inevitably) approaches 100%.

Another embodiment comprises the following components as shown in FIG. 17: a layer 2 of a material that is substantially transparent at 10.6 µm, an antireflection coating 3 tuned for 10.6 µm, and an EUV reflective cap layer 4.

The material of layer 2 is chosen to have a high transmittance at 10.6 µm. This layer is desirably made of diamond-like carbon (DLC), or $CO_2$ laser window materials such as ZnSe, ZnS, GaAs and Ge.

The AR coating 3 further reduces the infrared grazing-incidence reflectivity of layer 1. The optimal parameters of this coating depend on the range of grazing angles for which the reflectivity should be reduced. The AR coating may comprise for example $CO_2$ laser window materials such as ZnSe, ZnS, GaAs and Ge, and/or low refractive index halides such as $ThF_4$ and $YF_3$.

The cap layer 4 has a high reflectivity for EUV, for which typically a thickness of the order of 10 nm is desired. Since metals will generally reflect 10.6 µm radiation even when applied as a very thin layer, the capping layer 4 is desirably made of a non-metallic material, for example diamond-like carbon (DLC) or $TiO_2$.

Since the cap layer 4 also acts as an AR coating for DUV, its thickness is tuned so as to give the desired suppression in the DUV range.

In this embodiment, two mirrors may be arranged in a cross shape as shown in FIG. 3 and placed at intermediate focus. The structure shown in FIG. 17 is applied on both sides of each mirror, as shown in FIG. 18. To ensure that the infrared radiation is directed outside the EUV beam after transmission through the mirror, the backside of layer 2 is patterned according to aspects of this invention.

Figure 17A:
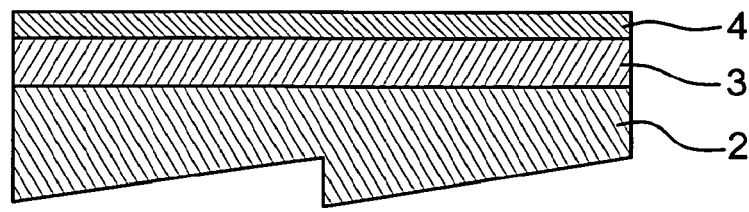
FIG. 17 depicts an embodiment of an optical element according to the invention.
Figure 18:
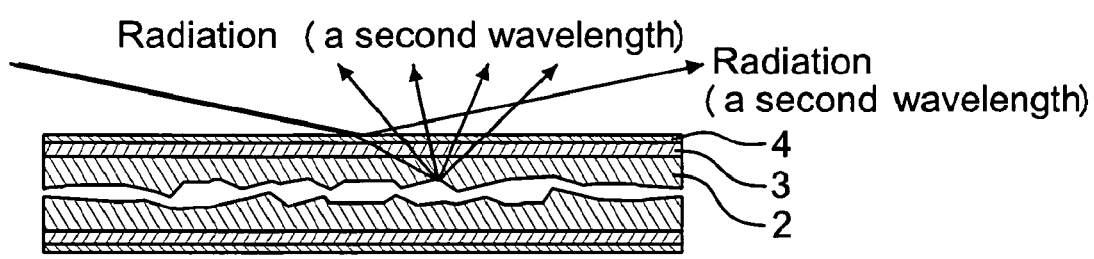
FIG. 18 depicts an embodiment of an optical element according to the invention.

In an embodiment, the backside may have a surface orientation that is generally inclined with respect to the EUV reflective cap layer 3, as shown in FIG. 17(a). The infrared radiation is then diffracted outside the solid angle in which EUV is reflected. The angle into which the radiation is directed is simply given by the surface normal and Snell's law, provided that the period of the sawtooth profile in FIG. 17(a) is much larger than the infrared wavelength.

In an embodiment, the pattern on the backside has a period of the order of the infrared radiation so that it acts as a transmission grating. The grating profile may be optimized so as to direct most of the radiation in diffraction orders outside the EUV beam.

Figure 17B:
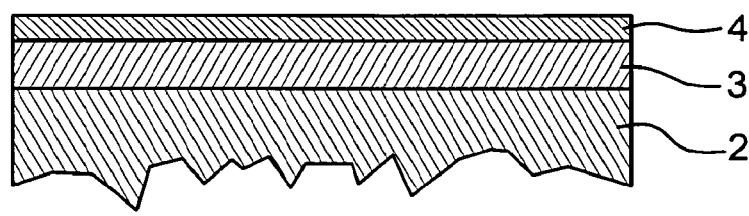
Figure 19A:
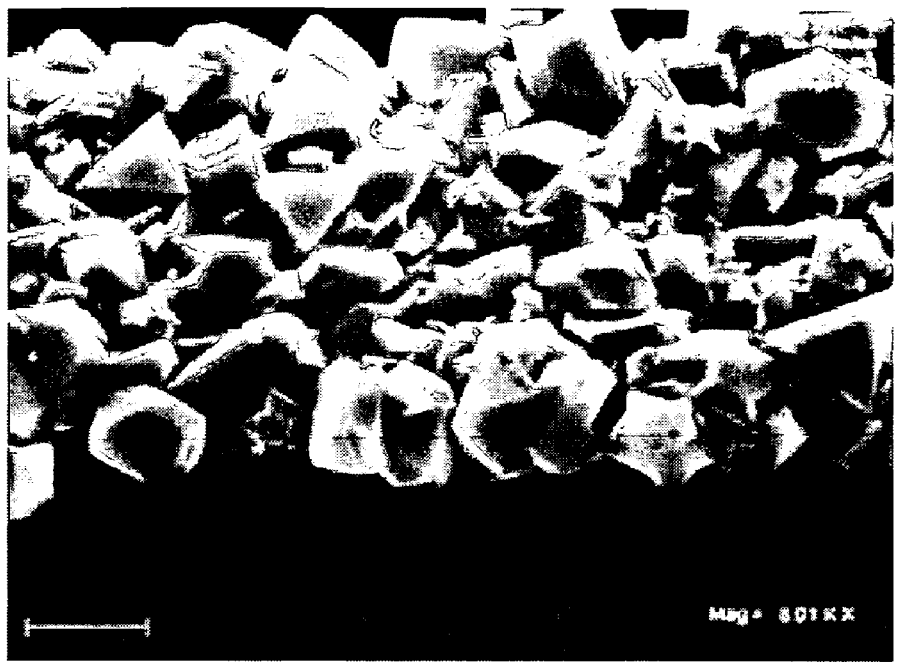
FIG. 19 depicts an example of diamond growth.
Figure 19B:
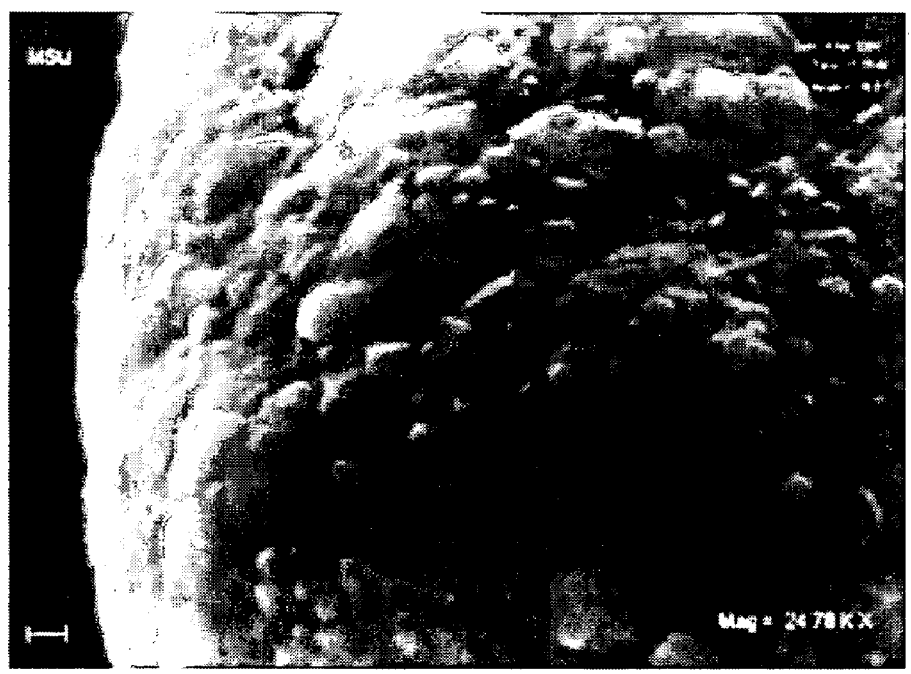

In an embodiment, shown in FIG. 17(b), the backside has a high surface roughness with a length scale of the order of the infrared wavelength (10.6 µm). In this case, the infrared radiation is scattered so that most of it is directed outside the EUV beam. This embodiment may have a particular advantage in that it may be easy to manufacture. For example, the material of layer 2 may be diamond as mentioned before, which may be grown on a flat substrate, for example Si. By choosing suitable growth parameters, the desired roughness may be automatically introduced in the top surface of the diamond layer as shown in FIG. 19. Consequently, after lift-off from the substrate, the layer has one smooth side and one rough side as depicted in FIG. 17(b). All that remains to be done is deposition of the coatings 3 and 4 on the smooth side of the layer.

In an embodiment based upon any of the preceding embodiments, also the patterned backside of the layer 2 may be coated with an antireflection coating similar to the AR coating 3 (but generally with different parameters). This additional AR coating may decrease internal reflection within layer 2 and thereby increase the transmittance of the total stack. The additional AR coating is optional because internal reflection is generally not a problem as long as the light is reflected or diffracted outside the EUV beam.

In an embodiment, the backside of layer 2 is not patterned or rough, but continuously inclined with respect to the EUV reflective surface. This may not be the preferred embodiment, as a substantial inclination angle (e.g. 5°) is needed to diffract the radiation outside the EUV beam. This will produce a relatively thick mirror, which may result in an undesirable increase of etendue if the SPF is placed at IF as shown in FIG. 3. Therefore, it may be desirable to break up the inclined surface in several steps, resulting in a sawtooth pattern as described in FIG. 17(a).

It may be assumed that incidence angles at intermediate focus range from 2° to 9° from the optical axis. This is relevant for the design of the AR coatings, which are optimized within a certain angular range. Although the minimum incidence angle from the optical axis is 2°, the minimum incidence angle on the mirrors is (close to) 0°. Therefore, the mirrors should be optimized for the range from 0° to 9°.

An embodiment for this angular range is as follows:
DLC [20 nm]/Ge [420 nm]/$ThF_4$ [5100 nm]/Ge [500 nm]/ZnSe [varying].

Here, the DLC layer is the EUV reflective cap layer, the Ge/$ThF_4$/Ge stack is the AR coating and the ZnSe layer is the infrared-transparent layer with patterned backside.

FIG. 4 shows the reflectivity of the typical embodiment for p-polarization and s-polarization at 13.5 nm. At this wavelength, the reflectivity is solely determined by the DLC cap layer. The effect of the polarization is very small and the reflectivity is >80% over the entire angular range.

FIG. 5 shows the infrared reflectivity of the mirror for specular reflection (i.e. not the part that is reflected by the backside of layer 2, which is generally directed outside the EUV beam). At 10.6 µm, there is a large difference in reflectivity for p-polarization and s-polarization. The purpose of the AR coating is to suppress the p-polarized radiation. The s-polarized radiation is then suppressed by the other mirror, for which it is p-polarized again. For this example, the antireflective properties of the AR coating are optimal at an angle of 4.5° with Rp<0.5%. Towards the high end of the angular range, the reflectivity increases to about 10%; towards zero incidence angle it (inevitably) approaches 100%.

The calculated total reflectivity for the basic embodiment is 85.1% at 13.5 nm and 10.7% at 10.6 µm, i.e. the total spectral purity is increased by a factor of 8. By using a laterally graded coating, the reflectivity at 10.6 µm can ideally be reduced to 3.29%, assuming that at each position on the SPF, radiation comes in at only one angle. Since in practice there is a range of incidence angles (depending on the source size and the thickness of the SPF mirror), the reduction will typically be smaller.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. An optical element comprising:
    a first layer comprising a first material, the first layer being configured to be substantially reflective for radiation of a first wavelength in a first direction and substantially transparent for radiation of a second wavelength;
    a second layer comprising a second material, the second layer being configured to be substantially absorptive or transparent for the radiation of the second wavelength; and
    a third layer comprising a third material in between the first layer and the second layer, the third layer being substantially transparent for the radiation of the second wavelength and configured to reduce reflection of the radiation of the second wavelength from a top surface of the second layer facing the first layer,
    the first layer being located upstream in the optical path of incoming radiation with respect to the second layer in order to improve spectral purity of the radiation of the first wavelength.

2. An optical element according to claim 1, wherein a bottom surface of the second layer facing away from the first layer is configured to be substantially reflective for radiation of the second wavelength in a second direction, the first direction and the second direction being substantially different from each other.

3. An optical element according to claim 1, wherein a bottom surface of the second layer facing away from the first layer is configured to be substantially diffractive for radiation of the second wavelength.

4. An optical element according to claim 1, wherein a bottom surface of second layer facing away from the first layer is configured to substantially scatter radiation of the second wavelength.

5. An optical element according to claim 4, wherein the bottom surface of the second layer has a surface roughness with a length scale of about the order of the second wavelength.

6. An optical element according to claim 1, further comprising a fourth layer, wherein the fourth layer is provided against the bottom surface of the second layer.

7. An optical element according to claim 1, wherein the first material comprises at least one material from the group consisting of diamond-like carbon and $TiO_2$.

8. An optical element according to claim 1, wherein the third material comprises at least one material selected from the group consisting of ZnSe, ZnS, GaAs, Ge, $ThF_4$, and $YF_3$.

9. An optical element according to claim 1, wherein the radiation of the first wavelength is EUV radiation.

10. An optical element according to claim 1, wherein the radiation of the second wavelength is infrared radiation.

11. An optical element according to claim 1, wherein the thickness of the first layer is such that the first layer is configured to act as an anti-reflection coating for a radiation of a third wavelength.

12. An optical element according to claim 11, wherein the thickness of the first layer is within the range of 1-20 nm.

13. An optical element according to claim 11, wherein the radiation of the third wavelength is DUV radiation.

14. An optical element according to claim 1, wherein substantially only EUV radiation is reflected.

15. An optical element according to claim 1, wherein about 70% to about 95% of the radiation of the first wavelength is reflected.

16. An optical element according to claim 15, wherein about 0% to about 50% of the radiation of the third wavelength is reflected.

17. An optical element according to claim 12, wherein about 0% to about 20% of the radiation of the second wavelength is reflected.

18. An optical device comprising at least two optical elements, each optical element comprising:
    a first layer comprising a first material, the first layer being configured to be substantially reflective for radiation of a first wavelength in a first direction and substantially transparent for radiation of a second wavelength;
    a second layer comprising a second material, the second layer being configured to be substantially absorptive or transparent for the radiation of the second wavelength; and
    a third layer comprising a third material in between the first layer and the second layer, the third layer being substantially transparent for the radiation of the second wavelength and configured to reduce reflection of the radiation of the second wavelength from a top surface of the second layer facing the first layer, the first layer being located upstream in the optical path of incoming radiation with respect to the second layer in order to improve spectral purity of the radiation of the first wavelength.

19. An optical device according to claim 18, wherein the reflecting surfaces of at least two of the optical elements are facing away from each other.

20. An optical device according to claim 18, wherein the reflecting surfaces of at least two of the optical elements are oriented transversely with respect to each other.

21. An optical device according to claim 20, wherein the reflecting surfaces are oriented at least substantially perpendicularly with respect to each other.

22. An optical element according to claim 1, wherein the first layer is configured to be substantially transparent to the radiation of the second wavelength.

23. A lithographic apparatus comprising:
an illumination system configured to condition a radiation beam;
a patterning device configured to pattern the radiation beam;
a support configured to hold a substrate; and
a projection system configured to project the patterned radiation beam onto a target portion of the substrate,
wherein the illumination system and/or the projection system comprises an optical element comprising
a first layer comprising a first material, the first layer being configured to be substantially reflective for radiation of a first wavelength in a first direction and substantially transparent for radiation of a second wavelength,
a second layer comprising a second material, the second layer being configured to be substantially absorptive or transparent for the radiation of the second wavelength, and
a third layer comprising a third material in between the first layer and the second layer, the third layer being substantially transparent for the radiation of the second wavelength and configured to reduce reflection of the radiation of the second wavelength from a top surface of the second layer facing the first layer,
the first layer being located upstream in the optical path of incoming radiation with respect to the second layer in order to improve spectral purity of the radiation of the first wavelength.

24. A lithographic apparatus according to claim 23, wherein a bottom surface of the second layer facing away from the first layer is configured to be substantially reflective for radiation of the second wavelength in a second direction, the first direction and the second direction being substantially different from each other.

25. A lithographic apparatus according to claim 23, wherein a bottom surface of the second layer facing away from the first layer is configured to be substantially diffractive for radiation of the second wavelength.

26. A lithographic apparatus according to claim 23, wherein a bottom surface of second layer facing away from the first layer is configured to substantially scatter radiation of the second wavelength.

27. A lithographic apparatus according to claim 26, wherein the bottom surface of the second layer comprises a surface roughness with a length scale about the order of the second wavelength.

28. A lithographic apparatus according to claim 24, further comprising a fourth layer, wherein the fourth layer is provided against the bottom surface.

29. A device manufacturing method comprising:
patterning a radiation beam to form a patterned radiation beam;
projecting the patterned radiation beam onto a substrate; and
reflecting the radiation beam with at least one optical element comprising
a first layer comprising a first material, the first layer being configured to be substantially reflective for radiation of a first wavelength in a first direction and substantially transparent for radiation of a second wavelength,
a second layer comprising a second material, the second layer being configured to be substantially absorptive or transparent for the radiation of the second wavelength, and
a third layer comprising a third material in between the first layer and the second layer, the third layer being substantially transparent for the radiation of the second wavelength and configured to reduce reflection of the radiation of the second wavelength from a top surface of the second layer facing the first layer,
the first layer being located upstream in the optical path of incoming radiation with respect to the second layer in order to improve spectral purity of the radiation of the first wavelength.

30. A device manufacturing method according to claim 29, wherein a bottom surface of the second layer facing away from the first layer is configured to be substantially reflective for radiation of the second wavelength in a second direction, the first direction and the second direction being substantially different from each other.

31. A device manufacturing method according to claim 29, wherein a bottom surface of the second layer facing away from the first layer is configured to be substantially diffractive for radiation of the second wavelength.

32. A device manufacturing method according to claim 29, wherein a bottom surface of the second layer facing away from the first layer is configured to substantially scatter radiation of the second wavelength.

33. A device manufacturing method according to claim 32, wherein the bottom surface of the second layer comprises a surface roughness with a length scale about the order of the second wavelength.

34. A device manufacturing method according to claim 30, further comprising a fourth layer, wherein the fourth layer is provided against the bottom surface.

* * * * *